United States Patent [19]
Dhong et al.

[11] Patent Number: 6,072,369
[45] Date of Patent: Jun. 6, 2000

[54] DIGITAL PHASE LOCKED LOOP CIRCUIT FOR PCR RECOVERY

[75] Inventors: Yong-Bae Dhong; Kwang-Ho Choi, both of Kyungki-do; Sarm-Goo Cho, Seoul; Kee-Tag Lim, Kwangju, all of Rep. of Korea

[73] Assignee: Korea Institute of Industrial Technology, Rep. of Korea

[21] Appl. No.: 09/156,249

[22] Filed: Sep. 18, 1998

[30]     Foreign Application Priority Data

Feb. 2, 1998 [KR] Rep. of Korea .......................... 98-2823

[51] Int. Cl.[7] ......................................................... H03L 7/00
[52] U.S. Cl. ................................ 331/17; 331/25; 370/516; 375/376
[58] Field of Search ......................... 331/25, 17; 370/516; 375/376

[56]     References Cited

U.S. PATENT DOCUMENTS 5,835,668   11/1998   Yanagihara ................................ 386/95

Primary Examiner—Siegfried H. Grimm
Attorney, Agent, or Firm—Alston & Bird LLP

[57]     ABSTRACT

Disclosed is a DPLL circuit including a PCR register receiving and storing PCR values; an LPCR counter counted by a system clock; an LPCR register fetching an LPCR value every PCR input cycle; a phase error detector determining a difference in values stored in the PCR and LPCR registers, and calculating a present phase error requiring compensation; an interpolator interpolating signals between phase error values; a gain calculator determining a difference between consecutive LPCR values, then calculating a gain value, a D/A converting portion multiplying values output from the interpolator and the gain calculator, then converting the resulting signals into analog signals; and a VCO generating system clock frequencies according to signal voltage output from the D/A converting portion. In another aspect, the DPLL circuit is used in MPEG2 systems. Here, the PCR register receives and stores PCR values, and the LPCR register fetches LPCR values, the PCR and LPCR values including a 9-bit extension and a 33-bit base, the base increasing by 1 every time the extension becomes 300. Further, the VCO generates frequencies in a predetermined range from 27 MHz according to signal voltage output from the D/A converting portion, and an STC circuit adds the difference in values between the PCR and the LPCR values to the LPCR base value, then outputs the resulting value.

17 Claims, 9 Drawing Sheets

DIGITAL PHASE LOCKED LOOP CIRCUIT FOR PCR RECOVERY

BACKGROUND OF THE INVENTION (a) Field of the Invention

The present invention relates to a digital phase locked loop (DPLL) circuit, and more particularly, to a DPLL circuit for recovering a 27 MHz system clock on the basis of a program clock reference (PCR) received in a demutiplexer of an MPEG2 system or a HDTV.

(b) Description of the Related Art

In a system using the MPEG2 standard or in HDTVs, data is packetized then transmitted through a transport stream (TS). In order to synchronize the data in a receiving part of the MPEG2 system or HDTV, an encoder codes the data on the basis of a 27 MHz system clock.

However, when transporting data through the TS, as a result of either a delay in the signal or influence received from the transport path, a time base of the receiving part becomes different from the transmission timing. Accordingly, buffer overflow or underflow occurs during decoding such that data can not be precisely recovered.

It is therefore necessary to have a predetermined delay between the encoder and a decoder, during which the data timing is found and recovered. A DPLL is used by one of the methods performing this operation. In this method, in order to synchronize a transmitting clock with a receiving clock using a DPLL, a counter value (i.e., a PCR value), driven by 27 MHz, is included in the TS in the transmitting end, then transmitted. Next, the PCR value is received in a DPLL of the receiving part, and using this as a basis, a system clock of 27 MHz is recovered.

Referring to FIG. 1, shown is a conventional DPLL circuit. As shown in the drawing, the conventional DPLL circuit comprises a PCR register 10 for receiving and storing a program standard clock; an LPCR (local program clock reference) counter counting by a system clock; an LPCR register 20 which fetches the LPCR counter value every PCR input cycle; a phase error detector 11 for obtaining a phase error using a PCR value and an LPCR value stored in the PCR register 10 and the LPCR register 20, respectively; a multiplier 12 for multiplying the output of the phase error detector 11 by a predetermined gain 13; an interpolator 14 receiving output of the multiplier 12 and interpolating a value between a previous input value and a present input value; a digital-analog converter (DAC) 15 receiving output of the interpolator 14 to generate a PWM output signal; a low-pass filter 16 receiving the pulse width modulation (PWM) output signal from the DAC 15, and removing high-frequency band signal components from the same to generate a mean signal voltage; a voltage controlled oscillator (VCO) 17 for generating frequencies in a predetermined range from 27 MHz according to the signal voltage of the low-pass filter 16; a divider 18 dividing the 27 MHz system clock frequencies for the supply as clock frequencies of the interpolator 14 and the DAC 15; an LPCR counter 19 using a clock output of the VCO 17; and a system time clock (STC) circuit 21 for adding a difference between the PCR base value and the LPCR base value to a base value of the LPCR, and outputting the resulting value.

However, in the conventional DPLL circuit as shown in FIG. 1, the process of (a) calculating a value of the difference between the presently-input PCR (PCRn) and the PCR input before the cycle (PCRn-1) every PCR cycle (ΔPCR= PCRn−PCRn-1); (b) reading the LPCR counter value, driven by the recovered 27 MHz, every time the PCR is input; and (c) calculating a value of the difference between the presently-input LPCR (LPCRn) and the directly prior LPCR (LPCRn-1) must be performed using software.

Further, the calculation to obtain the phase error $$\left( PHASEerr = \frac{\Delta PCR - \Delta LPCR}{\Delta LPCR} \right)$$

must also be performed using software. In addition to these calculations, the multiplication of the gain and the interpolating calculations are also performed using software.

As a result, a micro-controller must be employed to perform the computation of all the above calculations (ΔPCR value, ΔLPCR value, PHASEerr value, gain multiplication, and interpolation), thereby increasing overall manufacturing costs of the conventional DPLL circuit. In addition, application to other products is not easy, and operational speed is reduced.

Also, as a predetermined loop gain is multiplied to the PHASEerr before interpolation, in order to lock the DPLL circuit for stabilization of the same, a quantization error occurs before interpolation.

And finally, in the conventional DPLL circuit, since a predetermined gain is multiplied without relation to PCR intervals, the lock-up time changes according to PCR input.

SUMMARY OF THE INVENTION

The present invention has been made in an effort to solve the above problems.

It is an object of the present invention to provide a DPLL circuit which performs calculations using hardware such that the problems associated with the software processes of the conventional DPLL circuit are avoided.

It is another object of the present invention to provide a DPLL circuit which minimizes a quantization error, which occurs during interpolation, such that a lock-up time, changing according to PCR input, is maintained at a fixed level.

To achieve the above objects, the present invention provides a DPLL circuit. The DPLL circuit includes a PCR register for receiving and storing PCR values transmitted from a transmitting part; an LPCR counter, counted by a system clock; an LPCR register for fetching an LPCR value, which is a counter value of the LPCR counter, every PCR input cycle; a phase error detector, determining a difference in values stored in the PCR register and the LPCR register, and calculating a present phase error requiring compensation based on this difference in values; an interpolator, interpolating signals between phase error values output from the phase error detector; a gain calculator for determining a difference between a present LPCR value stored in the LPCR register and an immediately prior LPCR value, then calculating a gain value corresponding to the difference in LPCR values; a D/A converting portion, multiplying values output from the interpolator and the gain calculator, then converting the resulting signals into analog signals; and a VCO, generating system clock frequencies according to signal voltage output from the D/A converting portion.

According to a feature of the present invention, the PCR values stored in the PCR register include an extension of n-bits, and a base of m-bits, the base increasing by 1 every time the extension becomes a predetermined value, to and the LPCR values stored in the LPCR register include an extension of n-bits, and a base of m-bits, the base increasing by 1 every time the extension becomes a predetermined value.

According to another feature of the present invention, the DPLL circuit further comprises an STC circuit for adding a difference between the PCR base values and the LPCR base values to the LPCR base value, then outputting the resulting value.

The phase error detector comprises a first subtractor for subtracting values output from the PCR register and the LPCR register; and a compensation error extractor, subtracting a previous value from a present value output from the subtractor to obtain a present phase error to be compensated.

The phase error detector further comprises linear converters for performing linearization of the values stored in the PCR register and the LPCR register, and output the resulting values to the first subtractor.

The compensation error extractor comprises a delay element for delaying output values of the first subtractor; and a second subtractor for subtracting output values of the delay element from the output values of the first subtractor.

The gain calculator comprises an LPCR interval calculator calculating a difference between a present LPCR value and a previous LPCR value during PCR input cycles; and a gain normalizer for normalizing a loop gain according to output from the LPCR interval calculator.

The D/A converting portion comprises a multiplier for multiplying output values of the interpolator and the gain calculator; a DAC for receiving output from the multiplier to generate pulse width modulation (PWM) signals; and a low-pass filter receiving output signals of the DAC and removing high frequency band signal components from the same to generate a mean signal voltage.

The DAC comprises a first subtractor for subtracting values, being fed back from DAC output, from output values of the multiplier, a first integrator for integrating and outputting output values of the first subtractor; a second subcontractor, subtracting output values of the first integrator from values being fed back from the output values of the DAC; a second integrator for integrating and outputting output values of the second subtractor; and a quantizer for receiving output values of the second integrator and quantizing the same, then outputting the resulting values to the first and second subtractors.

The DPLL circuit further comprises a frequency divider for dividing the system clock frequencies output from the VCO, and supplying the same as clock frequencies for the interpolator and the DAC.

The interpolator comprises a first register, storing output of the phase error detector synchronizing with a first clock frequency value; a second register, synchronized with a second clock frequency, the second clock frequency being N-times faster than the first clock frequency; a subtractor, subtracting feedback output values of the second register from values output from the first register; a divider for dividing output values of the subtractor by the N value; a third register, storing values output from the divider synchronizing with the first clock frequency; and an adder, adding values of the second register and the third register, and outputting the resulting value to the second register.

In another aspect, a DPLL circuit used in MPEG2 systems includes a PCR register for receiving and storing PCR values, the PGR values including a 9-bit extension and a 33-bit base, the base increasing by 1 every time the extension becomes 300: an LPCR counter, counted by a system clock; an LPCR register for fetching LPCR values for every PCR input cycle, the LPCR values being counted by the LPCR counter and including a 9-bit extension and a 33-bit base, the base increasing by 1 every time the extension becomes 300; a phase error detector, determining a difference in values stored in the PCR register and the LPCR register, and calculating a present phase error requiring compensation based on this difference in values; an interpolator, interpolating signals between phase error values output from the phase error detector; a gain calculator for determining a difference between a present LPCR value stored in the LPCR register and an immediately prior LPCR value, then calculating a gain value corresponding to the difference in LPCR values; a D/A converting portion, multiplying values output from the interpolator and the gain calculator, then converting the resulting signals into analog signals; and a VCO, generating frequencies in a predetermined range from 27 MHz according to signal voltage output from the D/A converting portion; and an STC circuit for adding the difference in values between the PCR and the LPCR values to the LPCR base value, then outputting the resulting value.

The phase error detector comprises first and second linear converters for converting the values stored in the PCR register and the LPCR register into linear values; a subtractor for subtracting values output from the first and the second linear converters; and a compensation error extractor, subtracting a previous value from a present value output from the subtractor to obtain a present phase error to be compensated.

The gain calculator comprises an LPCR interval calculator, calculating $\Delta$LPCR values, which is a difference between consecutive LPCR values during PCR input cycles, and a gain normalizer for normalizing a loop gain according to output from the LPCR interval calculator.

According to a feature of the present invention, the gain normalizer uses 9 to 13 bits out of 33 base bits, and extracts PCR input cycles from the $\Delta$LPCR values.

According to another feature of the present invention, gain values, corresponding to the PCR input cycles, are pre-stored in a ROM.

The D/A converting portion comprises a multiplier for multiplying output values of the interpolator and the gain normalizer; a DAC for receiving output from the multiplier to generate PWM signals; and a low-pass filter receiving output signals of the DAC and removing high frequency band signal components from the same to generate a mean signal voltage.

BRIEF DESCRIPTION OF THE DRAWINGS

Further, objects and other advantages of the present invention will become apparent from the following description in conjunction with the attached drawings, in which.

DETAILED DESCRIPTION OF THE PREFERRED EMBODIMENT

Figure 1:
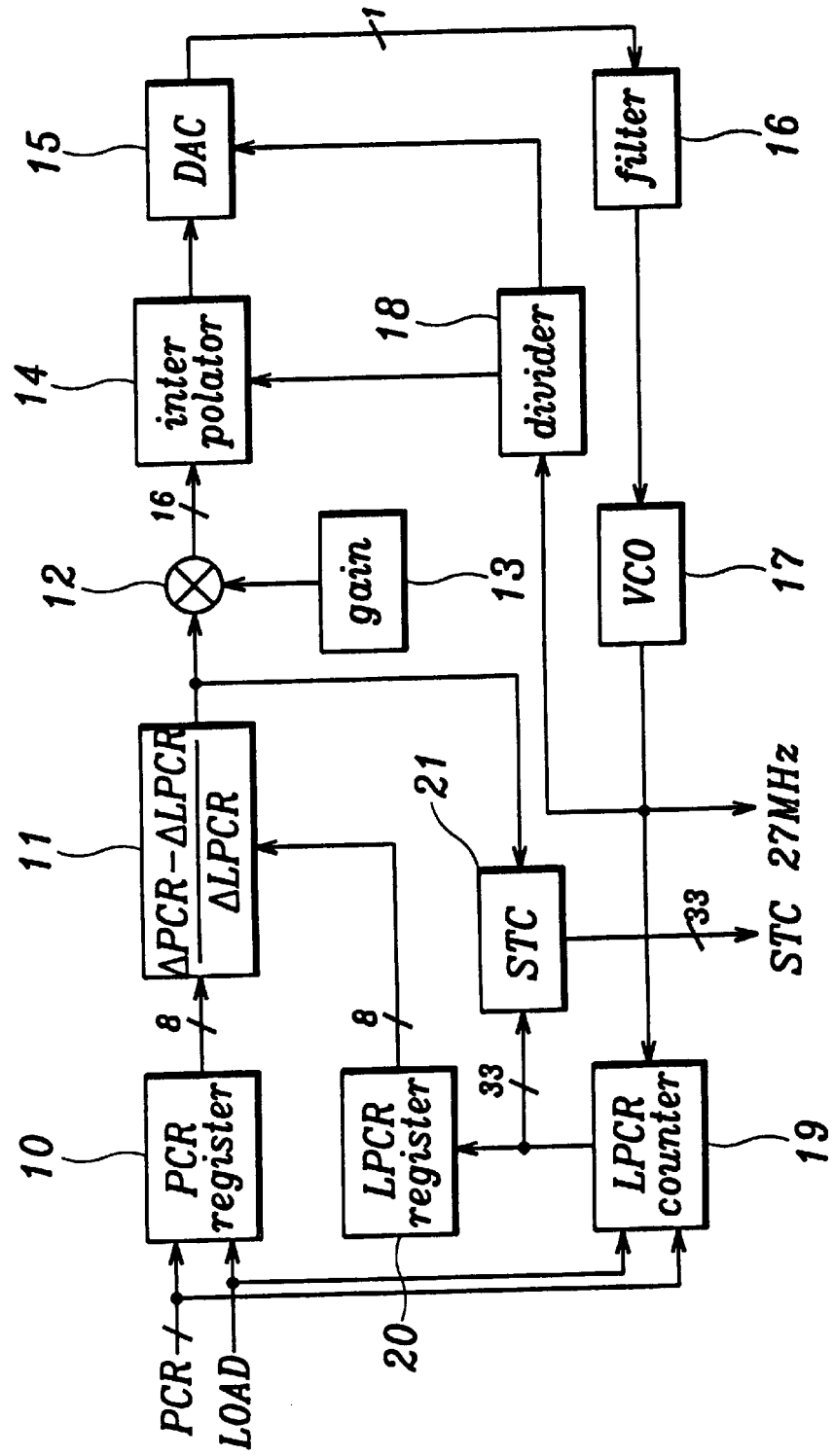
FIG. 1 is a block diagram of a conventional DPLL circuit.

A preferred embodiment of the present invention will now be described in detail with reference to the accompanying drawings. In the drawings, numbers appearing on signal lines refer to the size of data (i.e., data bit size)

Figure 2:
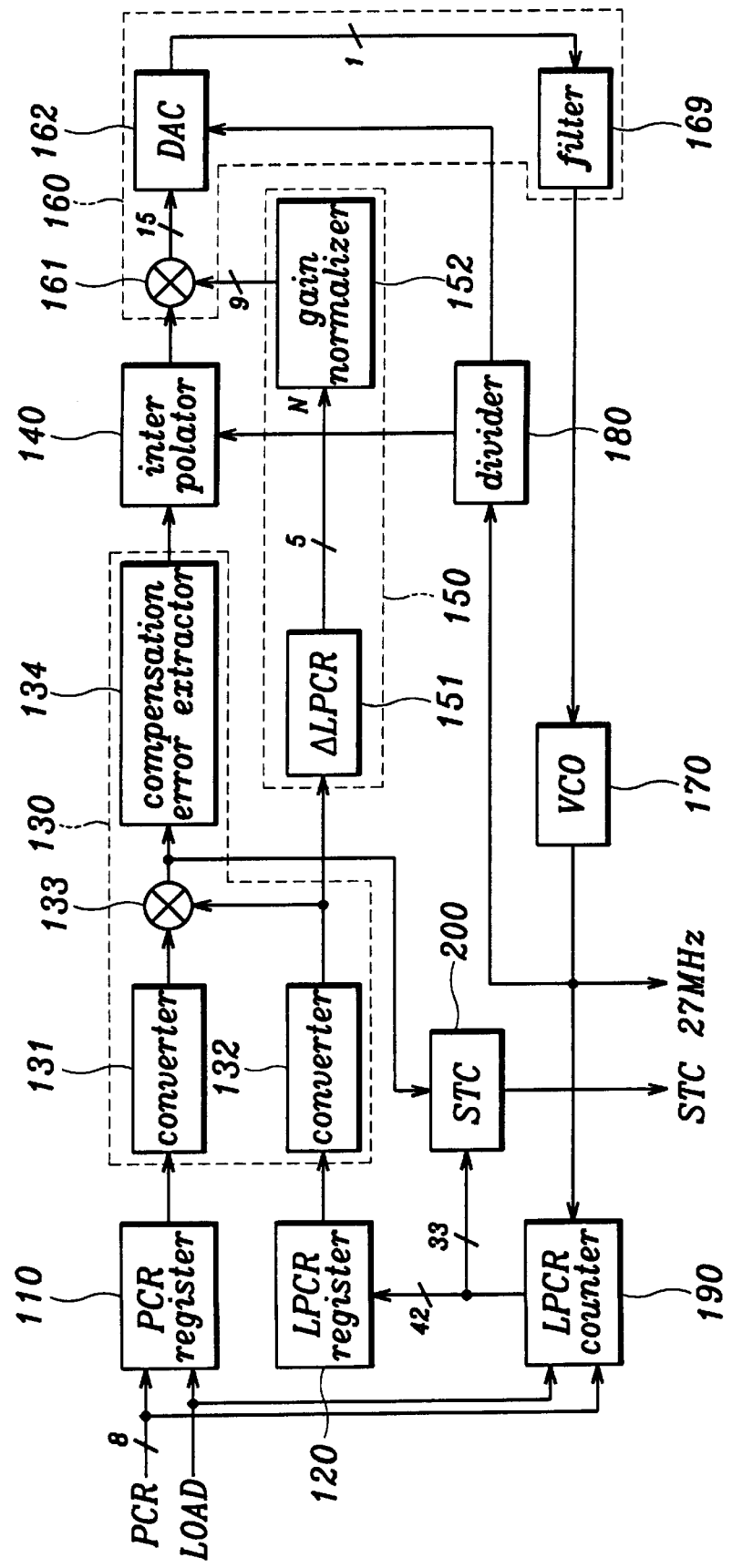
FIG. 2 is a block diagram of a DPLL circuit according to a preferred embodiment of the present invention.

FIG. 2 shows a block diagram of a DPLL circuit according to a preferred embodiment of the present invention. As shown in the drawing, the DPLL circuit comprises a PCR register 110, an LPCR register 120, a phase error detector 130, an interpolator 140, a gain calculator 150, a D/A converting portion 160, a voltage controlled oscillator (VCO) 170, a divider 180, an LPCR counter 190, and an STC circuit 200.

The PCR register 110 receives and stores a program clock reference (PCR) value transmitted from a transmitting part, and the LPCR register 120 fetches a value of the LPCR counter 190 every PCR input cycle.

The phase error detector 130 determines a difference in values stored in the PCR register 110 and the LPCR register 120, then, based on this difference in values, calculates a present phase error requiring compensation. The phase error detector 130 includes linear converters 131 and 132 for performing linearization of the values stored in the PCR register 110 and the LPCR register 120; a subtractor 133 for subtracting values output from the linear converters 131 and 132; and a compensation error extractor 134 which subtracts a previous value from a present value output from the subtractor 133 to obtain a present phase error to be compensated.

The interpolator 140 interpolates signals of a suitable size between the phase error values output from the phase error detector 130 in order to output signals having a high level of precision and to improve input signal speed.

The gain calculator 150 determines a difference between a present LPCR value stored in the LPCR register 120 and an immediately prior LPCR value (i.e., a difference between every two consecutive LPCR values), then calculates a gain value corresponding to the difference in LPCR values. For this operation, the gain calculator 150 includes an LPCR interval calculator 151 which calculates the differences between consecutive LPCR values during PCR input cycles, and a gain normalizer 152 for normalizing a loop gain according to output from the LPCR interval calculator 151.

The D/A converting portion 160 multiplies values output from the interpolator 140 and the gain calculator 150, then converts the resulting signals into analog signals. The D/A converting portion 160 includes a multiplier 161 for multiplying the values output from the interpolator 140 and the gain calculator 150, a digital-analog converter (DAC) 162 for receiving output from the multiplier 161 to generate pulse width modulation (PWM) signals, and a lowpass filter 169 receiving the PWM signals from the DAC 162 and removing high frequency band signal components from the same to generate a mean signal voltage.

The VCO 170 generates frequencies in a predetermined range (system clock frequencies) from 27 MHz according to the signal voltage of the low-pass filter 169 of the D/A converting portion 160. The divider 180 divides the 27 MHz system clock frequencies and supplies the same as clock frequencies for the interpolator 140 and the DAC 162.

The LPCR counter 190 counts according to the system clock output from the VCO 170. Further, the STC circuit 200 adds the difference in values between the PCR base value and the LPCR base value to an LPCR base value, then outputs the resulting value.

The DPLL circuit of FIG. 2 structured as in the above will be described in more detail hereinafter.

According to MPEG2 standards, clock standard values are sent within a maximum time of 0.1 seconds. These clock standard values are obtained by counting by a 27 MHz clock frequency, the values being in a 42-bit binary code.

These values are divided into a 9-bit extension portion and a 33-bit base portion. The base portion increases by 1 every time the extension portion becomes 300. The standard value, comprised of the base and extension portions, is referred to as a PCR value. The PCR values are made in packets in an encoder, and sent to a demultiplexer. The demultiplexer recovers a 27 MHz encoder clock frequency using the PCR values, the clock frequencies being set to have a frequency in the range of 30 partition per million (PPM).

Figure 3:
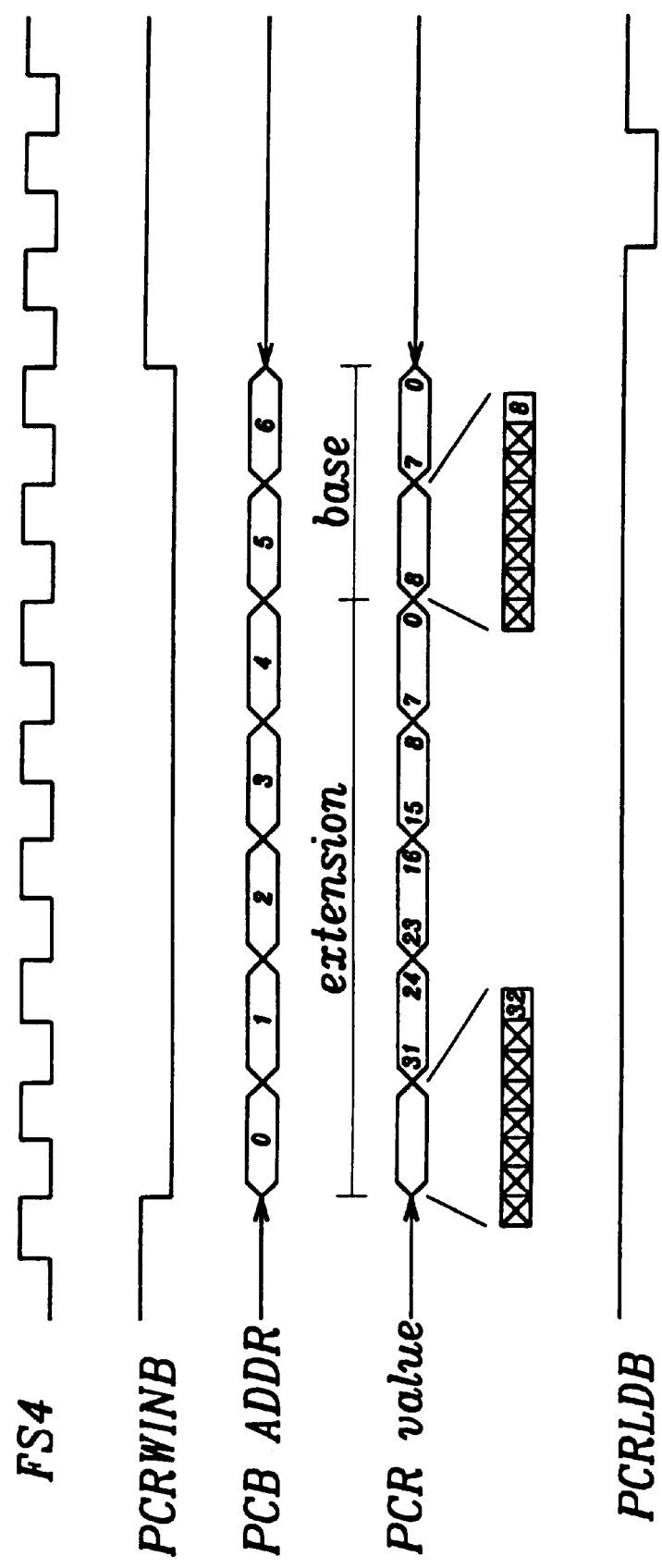
FIG. 3 shows line graphs used to describe an input timing of a PCR according to a preferred embodiment of the present invention.

The PCR register 110 of FIG. 2 stores 42-bit PCR values, storing the received PCR values in 8-bit units according to the input clock. As shown in FIG. 3, the PCR register 110 has seven register addresses, and each register address is input in units of 8 bits. Among these seven register addresses, two are stored as PCR values of the 9-bit extension portion, while the remaining five register addresses are stored as PCR values of the 33-bit base portion.

These 42-bit PCR values are stored in the interval when a "PCRWINB" signal is at "0", and are input in 8-bit units from a MSB (most significant bit). On the other hand, in the interval when a "PCRLDB" signal is at "0", the received PCR value is loaded in the LPCR counter 190 such that the LPCR counter 190 starts counting from the received PCR value.

The LPCR register 120 stores 42-bit values, counted by a 27 MHz local clock frequency, every time PCR values are input, and the size of the LPCR register 120 is the same as the PCR register 110, having a 9-bit extension portion and a 33-bit base portion, and the base increases by 1 every time the extension becomes 300.

The LPCR values stored in the LPGR register 120 and the PCR values stored in the PCR register 110 all have 9-bit extension portions and 33-bit base portions, and have non-linear structures with the base increasing by 1 every time the extension becomes 300. Accordingly, the PCR values and the LPCR values do not convert to linear numbers, and a precise difference between the PCR and LPCR values can not be obtained.

The linear converters 131 and 132, in order to convert the non-linear PCR and LPCR values into linear values, multiply each extension value by 300 then adds the resulting value to the base value. This computation is performed to a multiplication of a fixed number of decimal places and a constant number.

Differences in converted values are obtained by the subtractor 133, and these values are output to the compensation error extractor 134. The compensation error extractor 134 utilizes the ΔPCR value, corresponding to the difference between two consecutive PCR values, and the ΔLPCR, corresponding to the difference between two consecutive LPCR values, to compute a present phase error to be compensated.

For the above, in the DPLL circuit according to the preferred embodiment of the present invention, calculated are both (a) the difference in the PCR and the LPCR of the previous cycle {DPCRn-1=(PCRn-1)-(LPCRn-1)}, i.e., a previous accumulation error value; and (b) the difference in the present PCR and LPCR values (DPCRn=PCRn-LPCRn), i.e., a present accumulation error value. Subsequently, the previous accumulation error value DPCRn-1 is subtracted from the present accumulation error value DPCRn to obtain the present phase error. A tolerance range of the present phase error is largely limited by the PCR interval by the error components generated during one cycle.

Figure 4:
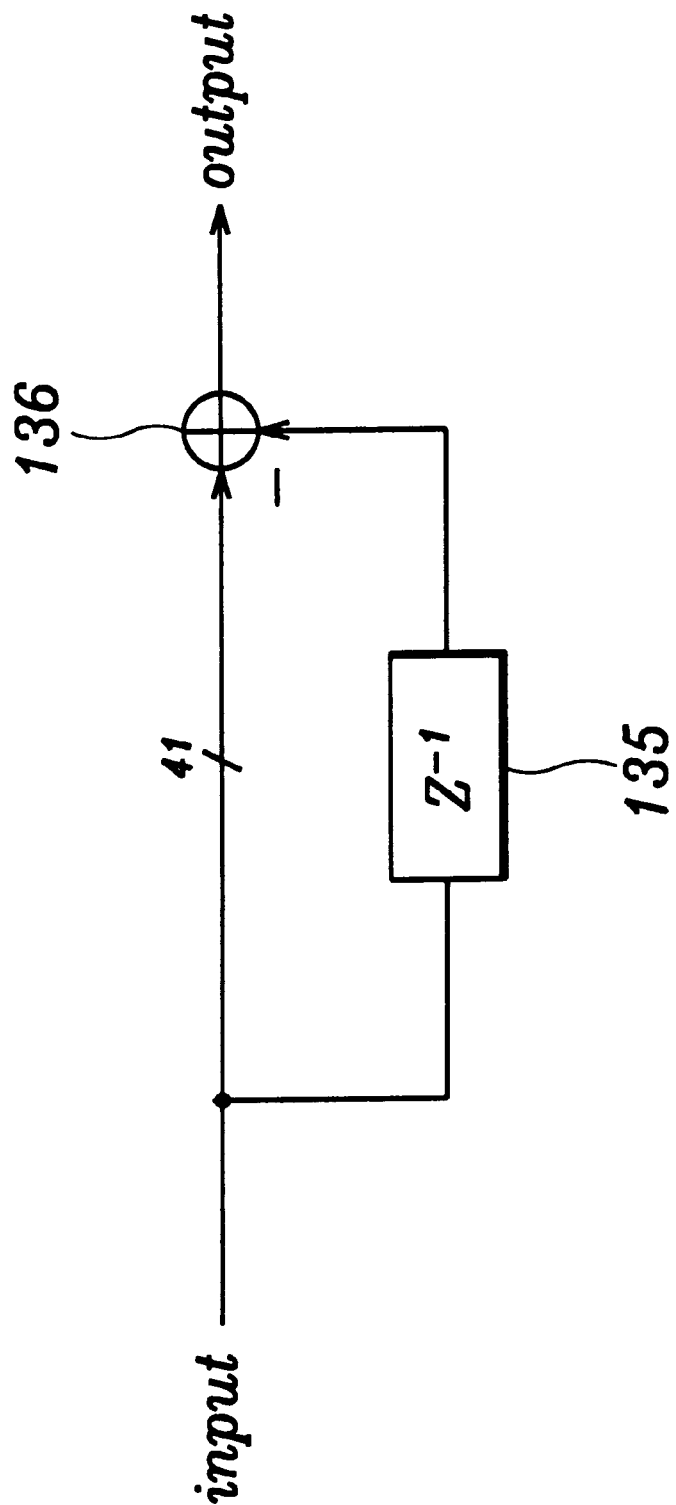
FIG. 4 is a detailed view of a compensation error extractor shown in FIG. 2.

FIG. 4 shows a detailed view of the compensation error extractor 134 shown in FIG. 2. As shown the drawing, the compensation error extractor 134 includes a delay element 135 for delaying the present accumulation error value DPCRn input into the compensation error extractor 134, and a subtractor 136 for subtracting the previous accumulation error value DPCRn-1 from the present accumulation error value DPCRn. The value output from the subtractor 136 becomes the present phase error to be compensated.

Figure 5:
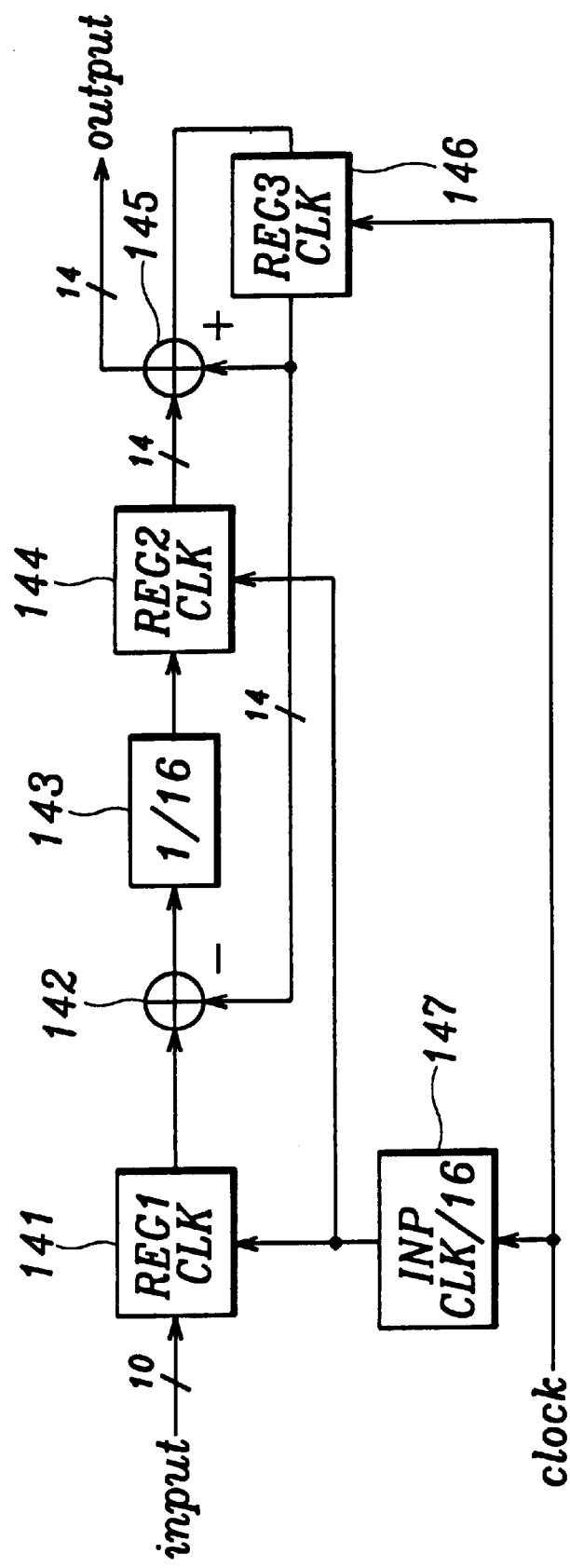
FIG. 5 is a detailed view of an interpolator shown in FIG. 2.

The interpolator 140 of FIG. 2 converts signals to 16 times the speed at which they are input. FIG. 5 shows a detailed view of the interpolator 140. As shown in the drawing, the interpolator 140 includes first, second and third registers 141, 144 and 146; a subtractor 142; a divider 143; an adder 145; and a frequency divider 147.

Output of the compensation error extractor 134 is input into the first register 141, and the first register 141 outputs stored values to the subtractor 142 being synchronized with a clock frequency of the frequency divider 147. The subtractor 142 subtracts an output value of the third register 146 from an output value of the first register 141. Next, the divider 143 divides the output value of the subtractor 142 by 16, after which the resulting value is output to the second register 144, the second register being synchronized with the clock frequency of the frequency divider 147.

The adder 145 receives as input output values of the second register 144 and the third register 146, and adds these two values. At this time, the second register 144 outputs values stored by being synchronized with the clock frequency of the divider 143, while the third register 146 outputs values that are 16 times faster than the clock frequency of the divider 143.

The above interpolator 140 increases the speed of the signals by 16 times while interpolating signal values of suitable size between the input signals, thereby obtaining interpolated output signals of high precision. That is, to interpolate between the present input and the previous input, the previous input value is first subtracted from the present input value, then the resulting value is divided by 16. At this time, in order to reduce the error of rounding to a decimal point, the figures rounded off are stored as a guard bit. Further, the divided value is added to output signals fed back every clock, which is 16 times faster than the cycles between the input signals, thereby being interpolated. Therefore, a signal value of 16-times speed is output during one cycle input.

Figure 7:
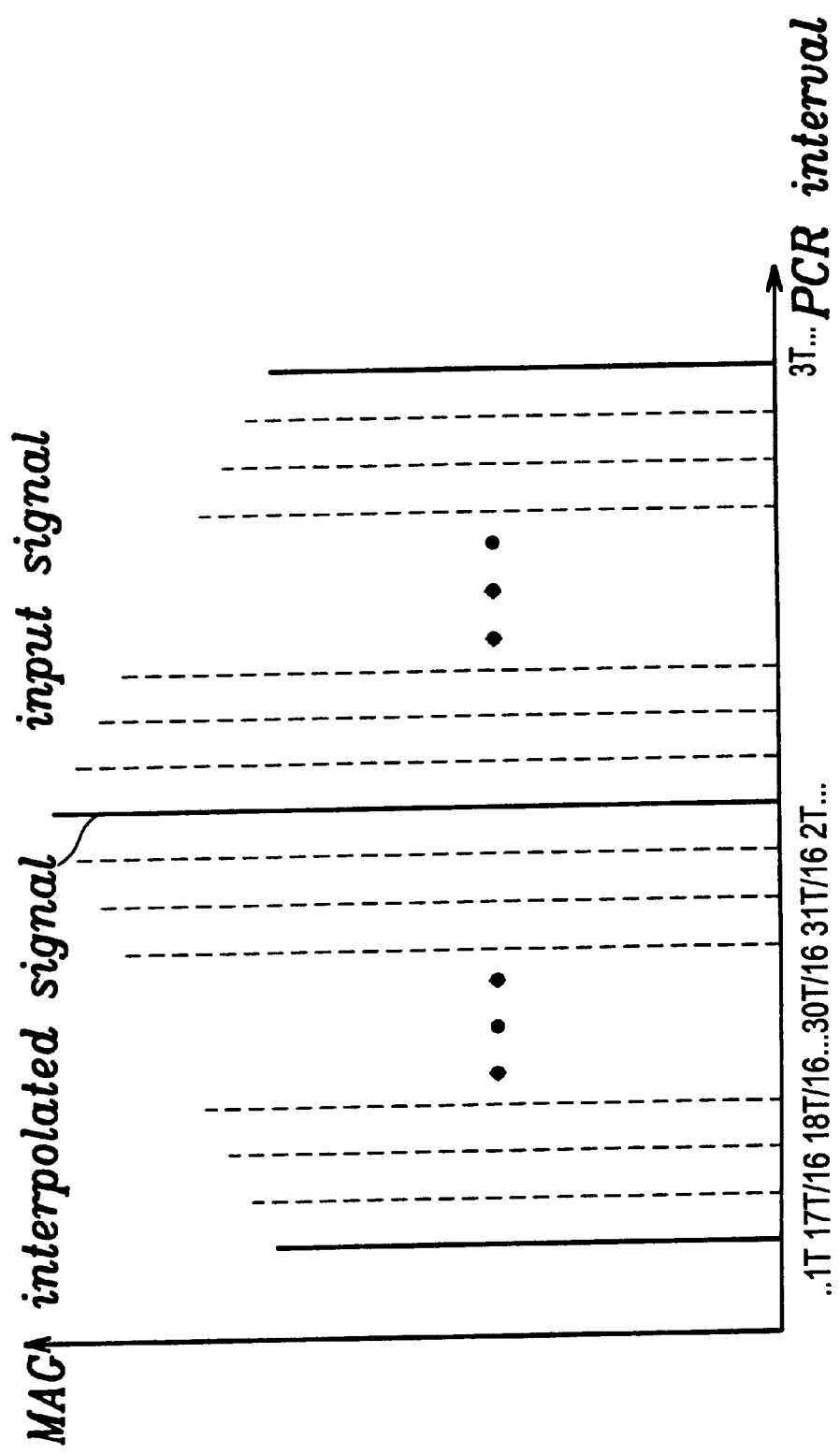
FIG. 7 is a graph illustrating signals input into an interpolator circuit and interpolated signals.

FIG. 7 shows a graph of the relation between input and output signals of the interpolator 140. The input signals are depicted with bold lines, and interpolated output signals are depicted with dotted lines. In the drawing, signal values are interpolated between the input signals, and output at a rate of 16 times faster than the same. The transfer characteristics of the interpolator 140 are shown by the formula below.

$$Y_{16m+n} = \left[\frac{16-n}{16}\right] X_{16m} + \frac{n}{16} X_{(16m+1)},$$

where $Y_{16m+n}$ is the output of a linear interpolator, $X_{16m}$ is the input of the previous cycle, and $X_{(16m+1)}$ is the present input, with n equaling (0, 1, 2, 3, 4 ... 13, 14, 15).

The gain normalizer 152 (see FIG. 2) normalizes the loop gain according to the output value of the LPCR interval calculator 151, thereby obtaining the gain to be multiplied to the output value of the interpolator 140.

The DPCR is the error value determined by the phase error detector 130 according to PCR intervals. As the DPCR is calculated without relation to PCR input cycles, in the case where the intervals of the PCR values change, the significance of the DPCR, or error value, also changes. For example, if the PCR values are input in intervals of 0.1 seconds. and the difference in the LPCR and PCR values is 1, the difference in frequency becomes 2.7 Hz; while if the PCR values are input at intervals of 0.01 seconds and the difference in the LPCR and PCR values is 1, the difference in frequency becomes 0.27 Hz. Accordingly, there must be compensation corresponding to the time intervals of the PCR values in order to attain precise values for these differences in frequency. That is, it is necessary to obtain the difference between LPCR and PCR every time interval, and the performing of such a process is referred to as normalization.

The calculation of values of the PCR input cycles can be obtained by subtracting a LPCR register value during the PCR input interval. That is, every time the PCR is received, the previous LPCR register value (LPCRn-1) is subtracted from the present LPCR register value (LPCRn), thereby obtaining ΔLPCR=LPCRn-LPCRn-1.

If the range of the PCR is between 0.1 and 0.01 seconds, the ΔLPCR values result in a range from 2,700,000 to 270,000. These values, which are used in the division process, are extracted using 9 to 13-bit values of a 33-bit base when the PCR operational range is between 0.1 and 0.01 seconds.

A suitable loop gain, with considerations of the extracted time intervals, must be added to the system for a lock-up time and system stability. The loop gain is calculated using design variables of a range of input voltages, operated by the VCO 170; a range of frequencies, which are able to adjust output; and a range of input of the DAC 162. The following formula is used to compute the loop gain:

$$GAIN_{topp} = \frac{\frac{\Delta VCO_\varepsilon}{5\,\text{Volt}} * DAC_\varepsilon}{FCR} = \frac{\frac{(3.2-1.8)}{5} * 2^{15}}{\frac{100}{10^6}} * \frac{1}{5\,\text{bit} * 2^9 * 300} = \frac{2^{10}}{5\,\text{bit}},$$

where ΔVCO is the input adjustment voltage range of the VCO, $DAC_\varepsilon$ is the input range of DAC, and FCR (frequency control range) is the lock range to which the system must be locked using the output frequency range of the VCO These ranges are normalized in ppm units.

Figure 8:
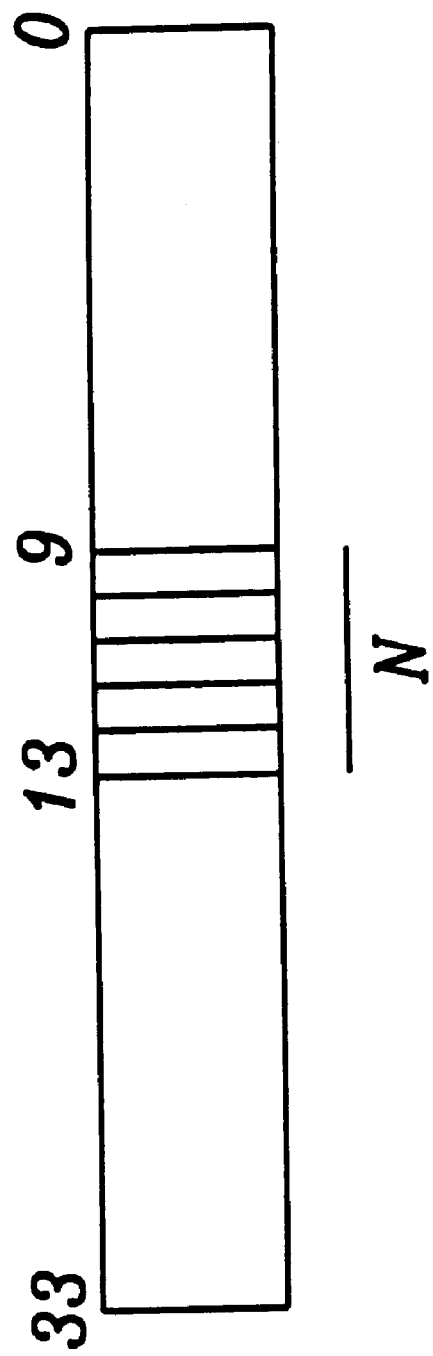
FIG. 8 illustrates a representative bit of a normalized coefficient (N) according to a preferred embodiment of the present invention.

FIG. 8 Illustrates a representative value of a normalized coefficient N according to ΔLPCR values. Of the ΔLPCR bits, only 5-bit values, between 9 and 13 bits, are extracted to be reflected in the calculation.

Division must be performed to obtain phase errors for each unit of time. However, after calculating values corresponding to each 5-bit value from the ΔLPCR values, these values are stored in a ROM, and if the values corresponding to ΔLPCR values are multiplied to the error values, division is not required, thereby requiring only the multiplier 161 (FIG. 2) to perform this process. Accordingly, the speed of processing data is increased.

Table 1 below shows normalized coefficients and gain values according to changes made in LPCR register values.

TABLE 1

| No. | PCR Interval | Normalized Coefficient (N, 5 Bits) | Gain |
|---|---|---|---|
| 1 | 0.010 | 1 | 420 |
| 2 | 0.014 | 2 | 250 |
| 3 | 0.020 | 3 | 156 |
| 4 | 0.025 | 4 | 126 |
| 5 | 0.034 | 5 | 98 |
| 6 | 0.039 | 6 | 89 |
| 7 | 0.045 | 7 | 73 |
| 8 | 0.051 | 8 | 64 |
| 9 | 0.056 | 9 | 56 |
| 10 | 0.060 | 10 | 51 |
| 11 | 0.067 | 11 | 46 |
| 12 | 0.073 | 12 | 42 |
| 13 | 0.079 | 13 | 39 |
| 14 | 0.085 | 14 | 36 |
| 15 | 0.090 | 15 | 34 |
| 16 | 0.090 | 16 | 32 |
| 17 | 0.100 | 17 | 30 |
| 18 | 0.105 | 18 | 28 |
| 19 | 0.110 | 19 | 26 |
| 20 | 0.115 | 20 | 25 |
| 21 | 0.120 | 21 | 24 |
| 22 | 0.127 | 22 | 23 |
| 23 | 0.136 | 23 | 22 |
| 24 | 0.140 | 24 | 21 |
| 25 | 0.145 | 25 | 20 |
| 26 | 0.150 | 26 | 19 |
| 27 | 0.155 | 27 | 18 |
| 28 | 0.160 | 28 | 18 |

Figure 6:
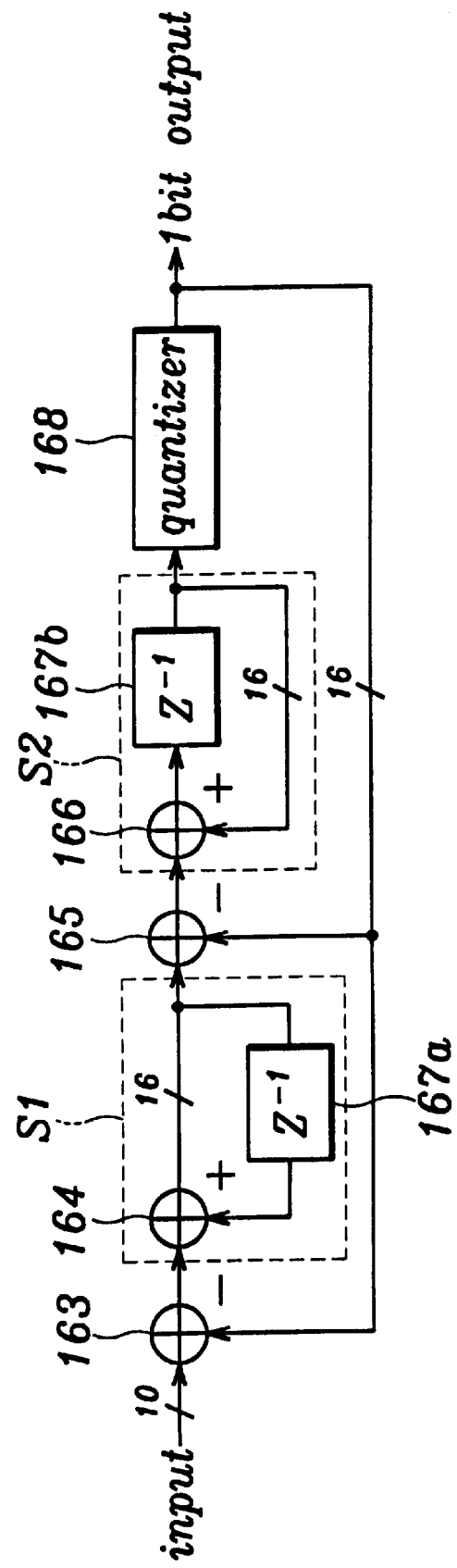
FIG. 6 is a detailed circuit diagram of an oversampling Sigma-Delta DAC shown in FIG. 2.

The DAC 162 (FIG. 2) has a second order utilizing an oversampling Sigma-Delta modulation method, and has a ratio of oversampling input signals by 5096 times. FIG. 6 illustrates a circuit diagram of the oversampling Sigma-Delta DAC 162.

As shown in FIG. 6, the DAC 162 comprises first and second subtractors 163 and 165, first and second adders 164 and 166, first and second delay elements 167a and 167b, and a quantizer 168. Here, the first adder 164 and the first delay element 167a are included in a first integrator S1, and the second adder 166 and the second delay element 167 are included in a second integrator S2.

Values from both the multiplier 161 of the D/A converting portion 160 and error components, output from the quantizer 168 of the DAC 162 and undergoing feed back, are input into the first subtractor 163. After these values are subtracted, they are integrated in the first integrator S1 and output. Output values of the first integrator S1 are subtracted from the error values output from the quantizer 168 in the second subtractor 165, and the resulting values are integrated in the second integrator S2, then output. The output of the second integrator S2 is provided as input to the quantizer 168.

In the DPLL circuit of the present invention, since the above loop is performed at an extremely fast speed, quantization errors undergo transition at a high frequency range such that high-precision output signals are obtained. Transmitting characteristics of this structure is indicated by the formula below.

$$Y_{(z)} = Z^{-1} X_{(z)} + (1-Z^{-1})^2 E_{(z)},$$

where $Y_z$ is the output of the oversampling Sigma-Delta DAC 162, $X_{(z)}$ is the input of the oversampling Sigma-Delta DAC 162, and $E_{(z)}$ is the error component of quantization.

The low-pass filter 169 of the D/A converting portion 160, realized through an RC filter, integrates high-frequency PWM signals, generated by the oversampling Sigma-Delta DAC 162, such that only low-frequency signals pass therethrough. Accordingly, noise of high frequency is removed, and analog voltage values, corresponding to the digital values input into the D/A converting portion 160, are output. The precise analog voltage, in which quantization errors in high-frequency components are removed, is applied as input to the VCO 170 such that stable output frequencies are generated. As a result, stability of the entire DPLL circuit is increased.

Figure 9:
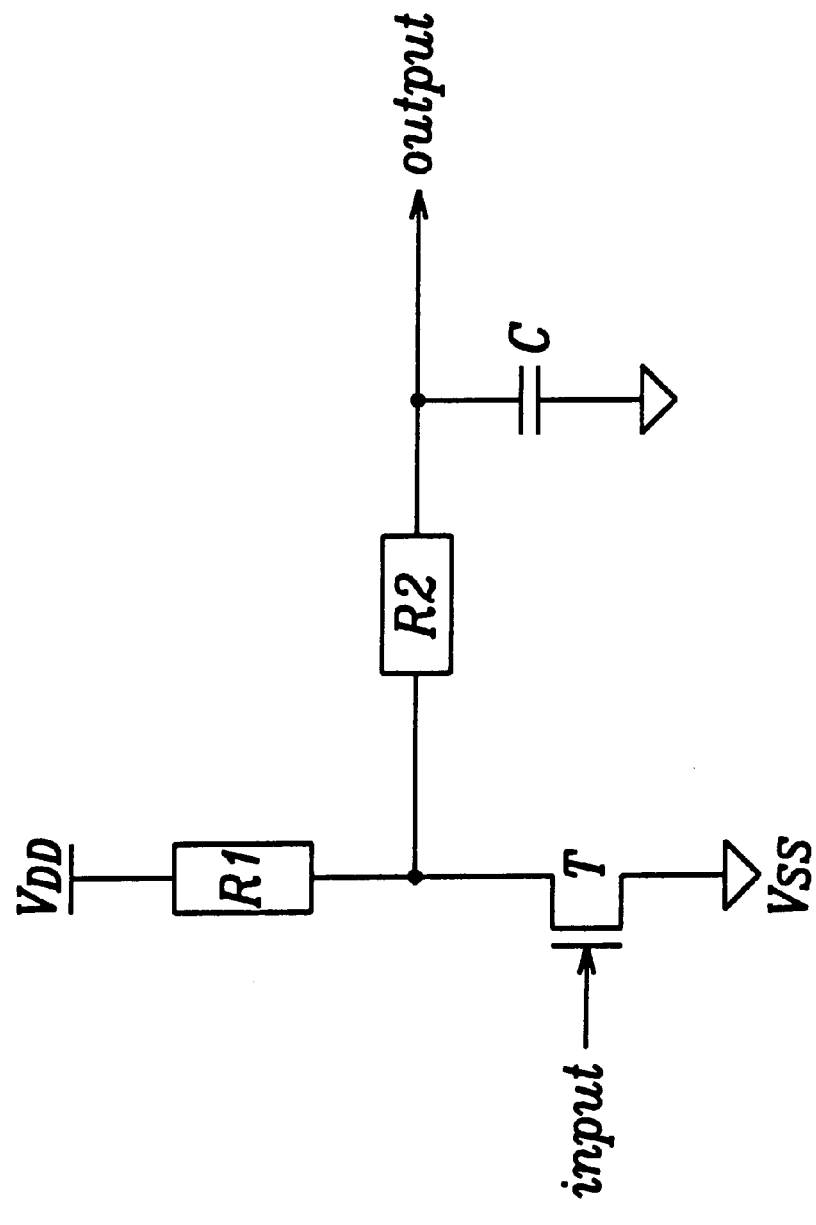
FIG. 9 is a detailed circuit diagram of a low-pass filter shown in FIG. 2.

FIG. 9 is a detailed circuit diagram of the low-pass filter 169 of FIG. 2. In the drawing, the output of the DAC 162 is applied to a gate of a MOS (metal oxide semiconductor) transistor (T) of the low-pass filter 169. Since the output of the DAC 162 operates the MOS transistor (T) to ON and OFF states, external Von voltage determines voltage values, which are charged in a capacitor (C) through resistors R1 and R2, according to the output of the DAC 162. At this time, values of the resistors R1 and R2, and the capacitor (C) determine the band of the filter, the filter band varying the lock-up time of the system.

That is, in the case where the filter band is narrow, the lock-up time is lengthened and the fluctuation of the frequencies of the VCO 170 is reduced, while the opposite results if the filter band is wide, Hence, it is necessary to adjust the width of the filter to an amount suitable to the system.

The VCO 170, which generates the 27 MHz demultiplexer system clock, is realized through a crystal in the present invention. The VCO 170 operates at a voltage of 5 volts and is linear at a range of +/−0.7 volts. Within this range, the frequency range of the VCO 170 becomes 27 MHz +/−30 ppm. This is realized externally together with the low-pass filter 169 of the D/A converting portion 160, and includes the limit of MPEG2 systems of 27 MHz +/−30 ppm.

The LPCR counter 190 is a 42-bit counter that counts by the 27 MHz clock frequencies generated in the VCO 170. The LPCR counter 190 is divided into a 9-bit extension portion and a 33-bit base portion, and the base increases by 1 every time the extension becomes 300.

The LPCR counter 190 loads PCR values when load signals (PCRLDB), shown in FIG. 3, are input, and begins counting with these values. Further, if the difference between input PCR values and LPCR counter values surpasses a predetermined range, PCR values are again loaded.

The STC circuit 200 outputs 33-bit values in parallel. These values are used to match the synchronization of DTS (decoding time stamps) and PTS (presentation time stamps). If signals requesting STC values are generated, DTS and PTS values become equal when the LPCR counter base portion 33 bit is added to the difference in the present PCR and LPCR values, thereby realizing synchronization. The DLPCR values are calculated when the STC values are requested, and are added to the LPCR base 33-bit.

The operation of the inventive DPLL circuit of FIG. 2 according to the preferred embodiment of the present invention will be described hereinafter.

The 42-bit PCR values received by the DPLL circuit are input in units of 8 bits, and input into the PCR register 110. Since the PCR values stored in the PCR register 110 are non-linear, they are converted into linear values in the linear converter 131. The values stored in the LPCR register 120 are also non-linear, and so are converted in the linear converter 132.

The values output from the linear converters 131 and 132 are output to the subtractor 133. where the accumulation error value of these two values is obtained. The compensation error extractor 134 subtracts the previous accumulation error value from the present accumulation error value to obtain the present phase error to be compensated.

The interpolator 140 receives output of the compensation error extractor 134, and interpolates between two signals to remove step errors and increase the speed of the input signals by a factor of 16. The signals output from the interpolator 140 are multiplied by the gain normalized according to the input PCR intervals. Here, since the intervals between the PCR signals are not fixed, the calculated compensation errors can not be used without such an adjustment.

Normalization is performed during PCR input cycles based on the differences in the LPCR values. That is, normalization values are obtained by calculating the difference between the present LPCR value and the previous LPCR value, and the system is locked to a suitable lock-up time such that appropriate gain is provided.

Interpolator output, multiplied by the normalized gain, is input into the DAC 162, and the DAC 162 performs oversampling of the input signals such that noise undergoes feedback and quantization noise experiences transition to a high frequency range The signals output from the DAC 162 are high-frequency PWM signals. Here, by passing through the low-pass filter 169, high-frequency component signals are removed from these signals, so that mean analog signals are output therefrom.

Voltage passing through the low-pass filter 169 is input into the VCO 170 as frequency adjusting voltage. The VCO 170 generates frequencies corresponding to the size of the voltage received from the low-pass filter 169, then outputs these frequencies. These frequencies again count the LPCR counter 190. The values of the LPCR counter 190 are read every time PCR values are input, and are fetched by the LPCR register 120. The difference in the values of the LPCR register 120 and those of the PCR register 110 are obtained, and the above process is repeated. With the repetition of the above operation, the VCO 170 generates frequencies directed by the PCR values.

In the DPLL circuit of the present invention structured and operating as in the above, with the recovering of the system clock using hardware, a more economical means of performing this function is provided, quantization errors occurring during interpolation are reduced, and a uniform lock-up time is realized.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. A DPLL circuit comprising:
   a PCR register for receiving and storing PCR values transmitted from a transmitting part;
   an LPCR counter, counted by a system clock;
   an LPCR register for fetching an LPCR value, which is a counter value of the LPCR counter, every PCR input cycle;
   a phase error detector, determining a difference in values stored in the PCR register, and the LPCR register, and calculating a present phase error requiring compensation based on this difference in values;
   an interpolator, interpolating signals between phase error values output from the phase error detector;
   a gain calculator for determining a difference between a present LPCR value stored in the LPCR register and an immediately prior LPCR value, then calculating a gain value corresponding to the difference in LPCR values;
   a D/A converting portion, multiplying values output from the interpolator and the gain calculator, then converting the resulting signals into analog signals; and
   a VCO, generating system clock frequencies according to signal voltage output from the D/A converting portion.

2. The DPLL circuit of claim 1 wherein the PCR values stored in the PCR register include an extension of n-bits, and a base of m-bits, the base increasing by 1 every time the extension becomes a predetermined value; and the LPCR values stored in the LPCR register include an extension of n-bits, and a base of m-bits, the base increasing by 1 every time the extension becomes a predetermined value.

3. The DPLL circuit of claim 2 wherein the DPLL circuit further comprises an STC circuit for adding a difference between the PCR base values and the LPCR base values to the LPCR base value, then outputting the resulting value.

4. The DPLL circuit of claim 1 wherein the phase error detector comprises:
   a first subtractor for subtracting values output from the PCR register and the LPCR register; and
   a compensation error extractor, subtracting a previous value from a present value output from the subtractor to obtain a present phase error to be compensated.

5. The DPLL circuit of claim 4 wherein the phase error detector further comprises linear converters for performing linearization of the values stored in the PCR register and the LPCR register, and output the resulting values to the first subtractor.

6. The DPLL circuit of claim 5 wherein the compensation error extractor comprises:
   a delay element for delaying output values of the first subtractor; and
   a second subtractor for subtracting output values of the delay element from the output values of the first subtractor.

7. The DPLL circuit of claim 1 wherein the gain calculator comprises:
   an LPCR interval calculator calculating a difference between a present LPCR value and a previous LPCR value during PCR input cycles; and
   a gain normalizer for normalizing a loop gain according to output from the LPCR interval calculator.

8. The DPLL circuit of claim 7 wherein the D/A converting portion comprises:
   a multiplier for multiplying output values of the interpolator and the gain calculator;
   a DAC for receiving output from the multiplier to generate pulse width modulation (PWM) signals; and
   a lowpass filter receiving output signals of the DAC and removing high frequency band signal components from the same to generate a mean signal voltage.

9. The DPLL circuit of claim 8 wherein the DAC comprises:
   a first subtractor for subtracting values, being fed back from DAC output, from output values of the multiplier;
   a first integrator for integrating and outputting output values of the first subtractor;

a second subtractor, subtracting output values of the first integrator from values being fed back from the output values of the DAC;

a second integrator for integrating and outputting output values of the second subtractor; and a quantizer for receiving output values of the second integrator and quantizing the same, then outputting the resulting values to the first and second subtractors.

10. The DPLL circuit of claim 8 wherein the DPLL circuit further comprises a frequency divider for dividing the system clock frequencies output from the VCO, and supplying the same as clock frequencies for the interpolator and the DAC.

11. The DPLL of claim 1 wherein the interpolator comprises:

a first register, storing output of the phase error detector synchronizing with a first clock frequency;

a second register, synchronized with a second clock frequency, the second clock frequency being N-times faster than the first clock frequency;

a subtractor, subtracting feedback output values of the second register from values output from the first register;

a divider for dividing output values of the subtractor by the N value;

a third register, storing values output from the divider synchronizing with the first clock frequency; and an adder, adding values of the second register and the third register, and outputting the resulting value to the second register.

12. A DPLL circuit used in MPEG2 systems comprising:

a PCR register for receiving and storing PCR values, the PCR values including a 9-bit extension and a 33-bit base, the base increasing by 1 every time the extension becomes 300;

an LPCR counter, counted by a system clock;

an LPCR register for fetching LPCR values for every PCR input cycle, the LPCR values being counted by the LPCR counter and including a 9-bit extension and a 33-bit base, the base increasing by 1 every time the extension becomes 300;

a phase error detector, determining a difference in values stored in the PCR register and the LPCR register, and calculating a present phase error requiring compensation based on this difference in values;

an interpolator, interpolating signals between phase error values output from the phase error detector;

a gain calculator for determining a difference between a present LPCR value stored in the LPCR register and an immediately prior LPCR value, then calculating a gain value corresponding to the difference in LPCR values;

a D/A converting portion, multiplying values output from the interpolator and the gain calculator, then converting the resulting signals into analog signals; and a VCO, generating frequencies in a predetermined range from 27 MHz according to signal voltage output from the D/A converting portion; and an STC circuit for adding the difference between the PCR base values and the LPCR base value to the LPCR base value, then outputting the resulting value.

13. The DPLL circuit of claim 12 wherein the phase error detector comprises:

first and second linear converters for converting the values stored in the PCR register and the LPCR register into linear values;

a subtractor for subtracting values output from the first and the second linear converters; and a compensation error extractor, subtracting a previous value from a present value output from the subtractor to obtain a present phase error to be compensated.

14. The DPLL circuit of claim 13 wherein the gain calculator comprises:

an LPCR interval calculator, calculating $\Delta$LPCR values, which is a difference between consecutive LPCR values during PCR input cycles; and a gain normalizer for normalizing a loop gain according to output from the LPCR interval calculator.

15. The DPLL circuit of claim 14 wherein the gain normalizer uses 9 to 13 bits out of 33 base bits, and extracts PCR input cycles from the $\Delta$LPCR values.

16. The DPLL circuit of claim 14 wherein gain values, corresponding to the PCR input cycles, are pre-stored in a ROM.

17. The DPLL circuit of claim 16 wherein the D/A converting portion comprises:

a multiplier for multiplying output values of the interpolator and the gain normalizer;

a DAC for receiving output from the multiplier to generate PWM signals; and a lowpass filter receiving output signals of the DAC and removing high frequency band signal components from the same to generate a mean signal voltage.

* * * * *

UNITED STATES PATENT AND TRADEMARK OFFICE
CERTIFICATE OF CORRECTION

PATENT NO. : 6,072,369
DATED : June 6, 2000
INVENTOR(S) : Dhong et al.

Page 1 of 1

It is certified that error appears in the above-identified patent and that said Letters Patent is hereby corrected as shown below:

<u>Title page,</u>
Item [73], Assignee, "Korea Institute of Industrial Technology" should read -- Korea Electronics Technology Institute --.

Signed and Sealed this

Nineteenth Day of February, 2002

Attest:

JAMES E. ROGAN
Attesting Officer
Director of the United States Patent and Trademark Office